(12) United States Patent
Huggins

(10) Patent No.: US 6,346,748 B1
(45) Date of Patent: Feb. 12, 2002

(54) ELECTRONIC CIRCUIT STRUCTURE WITH PHOTORESIST LAYER THAT HAS NON-PRECISION OPENINGS FORMED BY A LASER

(75) Inventor: Alan H. Huggins, Gilroy, CA (US)

(73) Assignee: Clear Logic, Inc., San Jose, CA (US)

( * ) Notice: Subject to any disclaimer, the term of this patent is extended or adjusted under 35 U.S.C. 154(b) by 0 days.

(21) Appl. No.: 09/275,057

(22) Filed: Mar. 23, 1999

Related U.S. Application Data

(62) Division of application No. 09/162,610, filed on Sep. 29, 1998, now Pat. No. 5,953,577.

(51) Int. Cl.[7] .............................................. H01L 23/48
(52) U.S. Cl. ....................... 257/759; 257/758; 257/760; 430/316
(58) Field of Search ........................... 438/759, 4, 735, 438/736, 690; 257/758–760; 430/311–318

(56) References Cited

U.S. PATENT DOCUMENTS

| | | | | |
|---|---|---|---|---|
| 5,336,925 A | * | 8/1994 | Moss et al. | |
| 5,616,960 A | * | 4/1997 | Noda et al. | |
| 5,702,868 A | * | 12/1997 | Kellam et al. | |
| 5,840,627 A | * | 11/1998 | Huggins | |
| 5,885,749 A | * | 3/1999 | Huggins et al. | |
| 5,892,286 A | * | 4/1999 | Toyoda et al. | |
| 5,953,577 A | * | 9/1999 | Huggins | |
| 5,985,518 A | * | 11/1999 | Huggins et al. | |
| 5,989,783 A | * | 11/1999 | Huggins et al. | |
| 6,025,256 A | * | 2/2000 | Swenson et al. | |
| 6,060,330 A | * | 5/2000 | Huggins et al. | |
| 6,080,533 A | * | 6/2000 | Huggins | |

OTHER PUBLICATIONS

Fujita et al., "Application and Evaluation of Direct–Write Electron Beam for ASICs," IEEE Journal of Solid–State Circuits, vol. 23, No. 2, pp. 514–519, Apr. 1988.*

* cited by examiner

Primary Examiner—Charles Bowers
Assistant Examiner—Stephen W. Smoot
(74) Attorney, Agent, or Firm—Skjerven Morrill MacPherson LLP; Tom Chen

(57) ABSTRACT

A method for patterning a layer of photoresist includes the steps of 1) exposing the photoresist through a standard precision mask to define all possible cut points, 2) etching all possible cut points in a dielectric layer, 3) selectively exposing a second layer of photoresist with a non-precision targeting energy beam or mask to select the desired cut points. Consequently, no custom precision masks are required to pattern the various layers of photoresist during the fabrication of application specific integrated circuits (ASICs), thereby reducing both the lead-time and costs for manufacturing ASICs.

8 Claims, 15 Drawing Sheets

ELECTRONIC CIRCUIT STRUCTURE WITH PHOTORESIST LAYER THAT HAS NON-PRECISION OPENINGS FORMED BY A LASER

CROSS REFERENCE TO RELATED APPLICATIONS

This application is a divisional application of U.S. patent application Ser. No. 09/162,610, now U.S. Pat. No. 5,953,577, entitled "Customization of Integrated Circuits", filed Sep. 29, 1998, and is related to commonly-owned U.S. patent application Ser. No. 08/823,777, now U.S. Pat. No. 5,840,627, entitled "Method of Customizing Integrated Circuits Using Standard Masks and Targeting Energy Beams for a Single Resist", filed Mar. 24, 1997, Ser. No. 08/823,778, now U.S. Pat. No. 5,985,518, entitled "Method of Customizing Integrated Circuits Using Standard Masks and Targeting Energy Beams", filed Mar. 24, 1997, Ser. No. 08/846,163, now U.S. Pat. No. 6,060,330, entitled "Method of Customizing Integrated Circuits by Selective Secondary Deposition of Interconnect Material", filed Apr. 25, 1997, and Ser. No. 08/879,542, now U.S. Pat. No. 5,885,749, entitled "Method of Customizing Integrated Circuits by Selective Deposition of Layer Interconnect Material", filed Jun. 20, 1997.

BACKGROUND

1. Field of the Invention

The present invention relates to methods of customization of integrated circuits, and more particularly, to an improved method of customizing integrated circuits without using expensive custom masks.

2. Related Art

Photolithography is used to transfer specific patterns onto semiconductor devices or integrated circuits during the fabrication process. A masking step transfers the pattern of a photomask onto a photoresist layer on the device surface by exposing the photoresist through the mask. Selected areas of the photoresist, based on the pattern of the mask, are then etched so that subsequent process steps, such as impurity introduction, oxidation, and metallization, can be performed. A semiconductor device with the desired electrical properties is then obtained after several of these application-specific masking and processing steps.

For example, a custom or application specific-integrated circuit (ASIC), frequently used to implement new circuit designs, may require several different custom masks during the fabrication process since each layer of the device needs to be specifically patterned. Because precision custom masks are costly to manufacture, a large quantity of each integrated circuit (IC) type must be produced in order for the fabrication process to be economical. However, as technology advances, circuit designs become more application-specific and are typically required at a much lower volume than the more generic ICs, thus making fabrication of such application-specific ICs more expensive per unit.

In an attempt to reduce the costs per unit of ASICs, a current practice is to use gate arrays to customize integrated circuits in order to minimize the number of different custom configuration mask steps. Gate arrays are mass-produced integrated circuits containing generic arrays of circuit elements ("gate array blanks"), which can be customized into application-specific ICs with a small number of masks defining custom interconnections of the circuit elements at the final steps of fabrication. The gate array blanks can be manufactured up to the customization steps and stored away until an order for a particular application-specific circuit is received. A precision configuration mask is then used to customize the specific gate arrays. However, the high costs of precision configuration masks limit the extent that costs and lead-time of ASICs manufacturing can be reduced.

An alternative method is to use direct write technology (techniques other than those where a photomask is the means of creating a pattern) on gate array processing to replace the steps requiring custom configuration masks. However, using programmable direct-write machines can still incur substantial costs to the manufacture of prototype and production ASICs. The feature sizes required to maintain a competitive die size require the use of expensive precision equipment with small spot sizes and low throughput. The low throughput results in a high processing cost for the customization step.

Accordingly, it is desirable to pattern photoresist so that fabricating customized integrated circuits can be accomplished without the drawbacks of conventional methods in order to reduce both lead-time and costs of designing and manufacturing ASICs.

SUMMARY

According to the present invention, a method is provided for patterning photoresist to create a customization method for an integrated circuit structure by combining precision and non-precision lithography without the need of a precision configuration mask, thereby reducing costs, complexity, and lead-time for fabricating an application specific integrated circuit (ASIC). Precision lithography, as mentioned above, is defined for these purposes as being capable of achieving the minimum design rule pitch, whereas non-precision lithography is defined for these purposes as being capable of no better than two times the minimum design rule pitch. One or more layers of metal (or non-metallic conductive material hereinafter referred to generally as "metal") are patterned on the gate array blank, with the surface layer configured with multiple configuration points (hereinafter referred to generally as "cut points"), which represent possible cut points of a conductor. It is also possible to define cut points in lower conductor layers.

A layer of dielectric material is deposited on top of the metal layer(s) to be customized. The dielectric layer may or may not be planarized. A layer of photoresist is applied (either positive or negative polarity) over the dielectric layer. A standard precision mask or another precision technique (hereinafter referred to generally as "mask") is used to define all possible cut points on the photoresist for any application or user. The photoresist is then developed, and the dielectric is etched down to the metal. Alternatively, via holes may also be patterned, developed, and etched with the same mask for later connection to an underlying metal layer. The word "via" in this document will be used to describe an opening in the dielectric which is used for the purpose of connecting to circuit elements on an underlying layer. Alternatively, instead of etching the dielectric down to the metal, the dielectric could be etched to a point just before the metal, resulting in a thin protective layer of dielectric over the metal. The device may be stored for later customization. When customization is desired, a second layer of photoresist is applied and then customized using a non-precision technique to select the desired features defined by the precision mask. Thus, the precision mask controls the feature size, while the non-precision step selects which features are desired.

In one embodiment of the present invention, the use of negative photoresist or other energy sensitive etch barrier (hereinafter referred to generally as "negative photoresist") for the second application of photoresist is used on the device surface above the metal and dielectric layers. A programmable energy beam, (such as an electron or ion beam or targetable light ray), hereinafter referred to generally as a "laser", is used to expose the resist in areas, typically larger than the openings, over the cut points to be protected and not acted upon. The resist is then developed to uncover the openings not selected by the laser. The device may then be processed through a metal etch or acted upon through these openings if the dielectric layer had previously been removed. If the thin dielectric layer still exists, then a dielectric etch is performed prior to etching the metal.

In another embodiment of the present invention, the use of positive photoresist for the second application of photoresist is used on the device surface above the metal and dielectric layers. A laser is used to expose the resist in areas, typically larger than the openings, over the cut locations to be opened and acted upon. The resist is then developed to uncover the openings selected by the laser. The device may then be processed through a metal etch or acted upon through these openings.

In another embodiment of the present invention, two layers are deposited between the potential metal cut points and the photoresist, which is applied and then customized using a laser. The application of the additional layer can be used as a potential final device protector and structural enabler, which may be required in some situations. Therefore, if the application of the additional layers occurs prior to customization, manufacturing cost and time can be reduced. The upper layer (e.g., a passivation layer) is deposited on top of a lower layer (e.g., a dielectric layer). The upper layer has etching properties dissimilar enough from the lower layer to limit the etch of the lower layer in order to maintain specific possible cut locations. After the laser has defined the specific locations of potential cut points, the resist is developed and the remaining layers are etched down to expose the metal. The device may then be processed through a metal etch or acted upon through these openings.

In other embodiments, multiple layers of dielectric and/or conductive-interconnect layers can be patterned utilizing the concepts of the present invention.

In the above embodiments, a laser is used as the tool for the non-precision step processing. However, in yet other embodiments, irradiation through a non-precision configuration mask can replace the non-precision direct-write step. The configuration mask can be made by first applying an opaque layer onto a mask blank and then depositing a resist layer over the opaque layer. A laser then exposes portions of resist over the opaque layer, and desired areas of the mask are removed through conventional mask-making methods. Alternatively, a laser can remove desired opaque areas by direct ablation. Furthermore, a configuration mask can be modified by removing additional opaque areas or re-used by applying another layer of opaque material and using the laser as described above. The old opaque material may be removed or left in place.

Accordingly, these above methods of combining precision and non-precision techniques can be used to customize integrated circuits without requiring a customized precision configuration mask, thereby reducing time and costs for manufacturing such masks.

This invention will be more fully understood upon consideration of the detailed description below taken together with the accompanying drawings.

BRIEF DESCRIPTION OF THE DRAWINGS

Use of the same reference numbers in different figures indicates similar or like elements.

DETAILED DESCRIPTION

The present invention provides a method for patterning two independent layers of photoresist on a device which results in the etching of dielectric layer(s) and subsequent metal layer(s) combining precision and non-precision lithography without the need of a precision configuration mask. The present invention uses a mask to define all possible cut points in the photoresist over a dielectric layer for a specific type of application or user. The photoresist is then developed and the dielectric is etched down to the metal. When customization is desired, a second layer of photoresist is applied and then customized using a laser to select the desired cut points defined by the precision mask. Thus, the mask defines the dimensions of the cut points, while the laser selects which cut points are to be acted upon.

Figure 1:
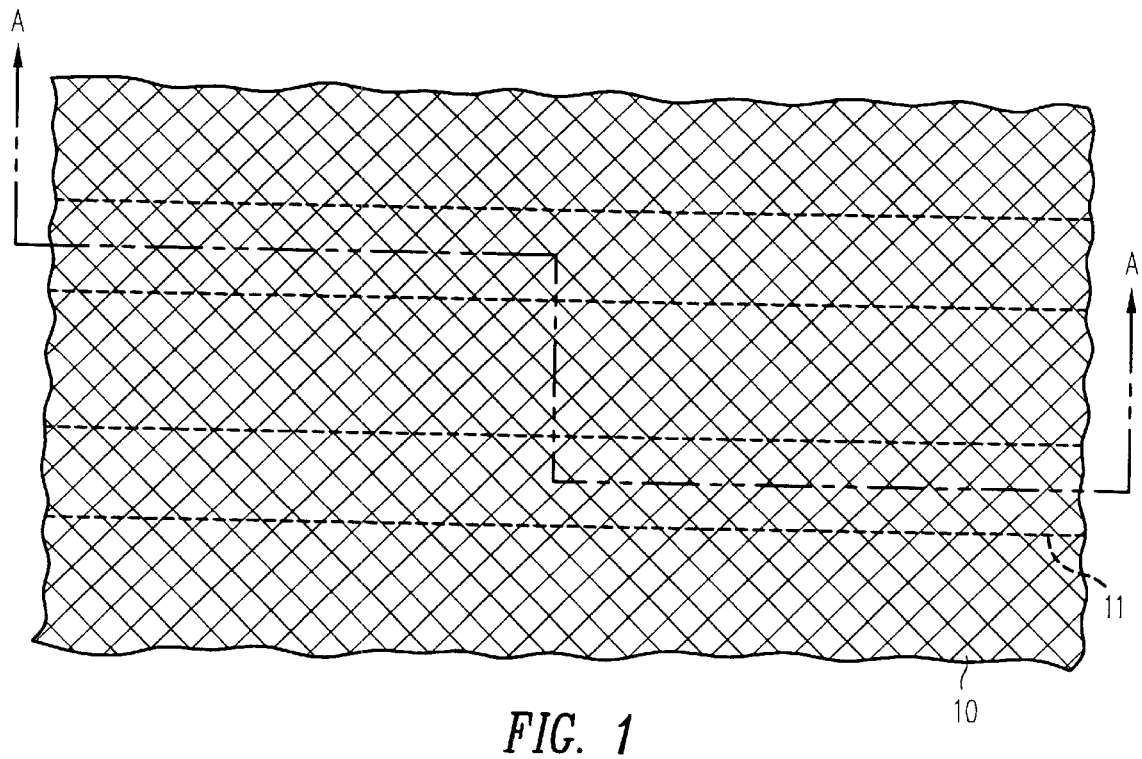
FIGS. 1–12 are illustrative top and sectional views representing steps to pattern a single layer of dielectric and a single layer of interconnect using two layers of photoresist according to one method of the present invention.
Figure 2:
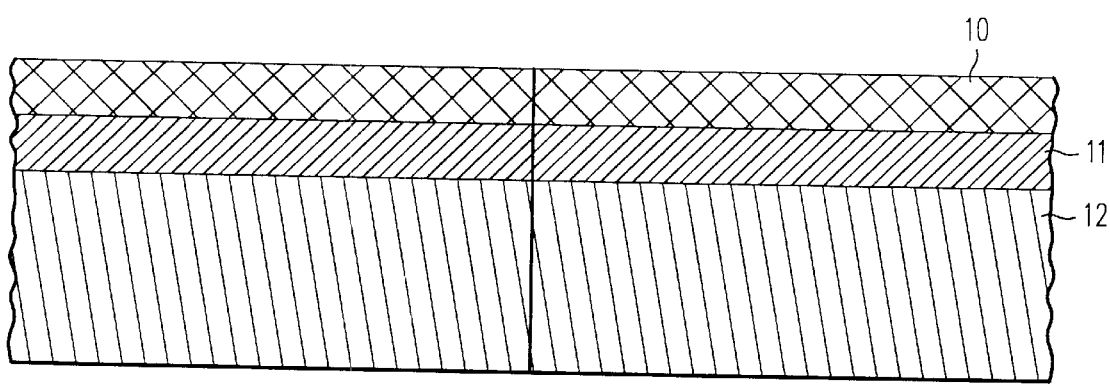

FIGS. 1–12 illustrate one embodiment of the present invention for patterning a single layer of dielectric and a single layer of interconnect using two layers of photoresist. In FIGS. 1 and 2, representing respective top and side views, a layer of dielectric 10 is deposited over structure 12 and over an underlying metal interconnect layer 11, where dielectric 10 can be patterned with all possible cut points. The layer of dielectric 10 can be deposited directly on metal interconnect layer 11 or on any suitable intervening layers over the metal interconnect layer 11.

Figure 3:
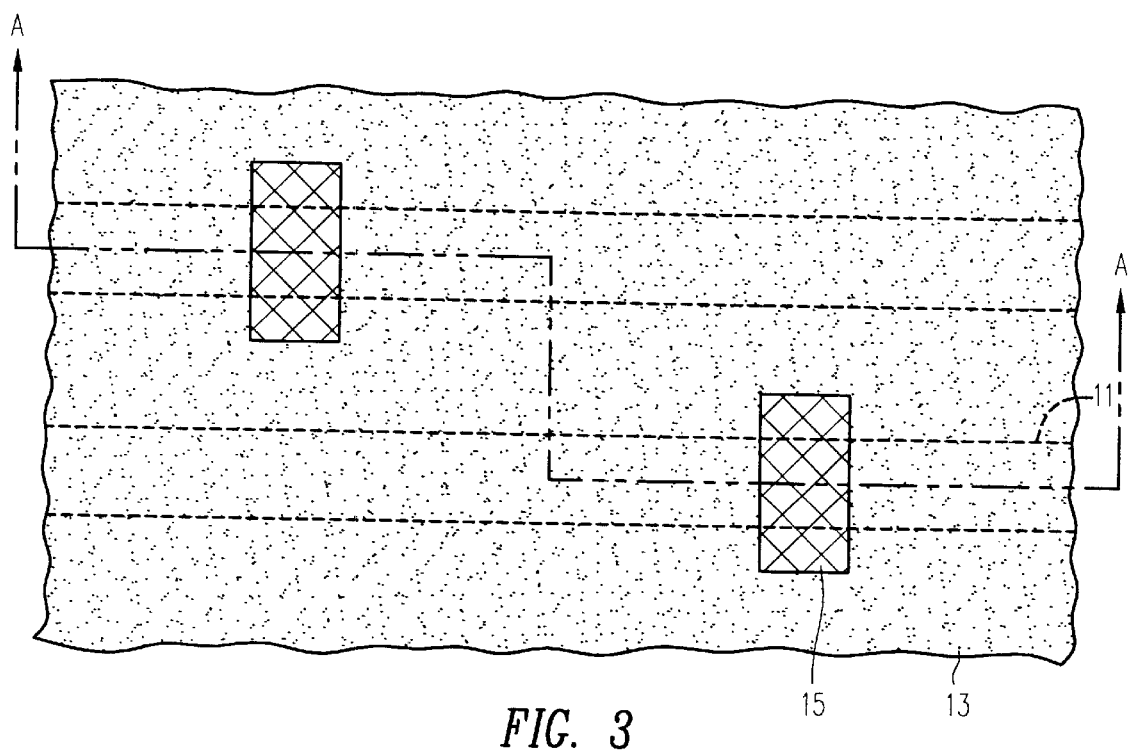
Figure 4:
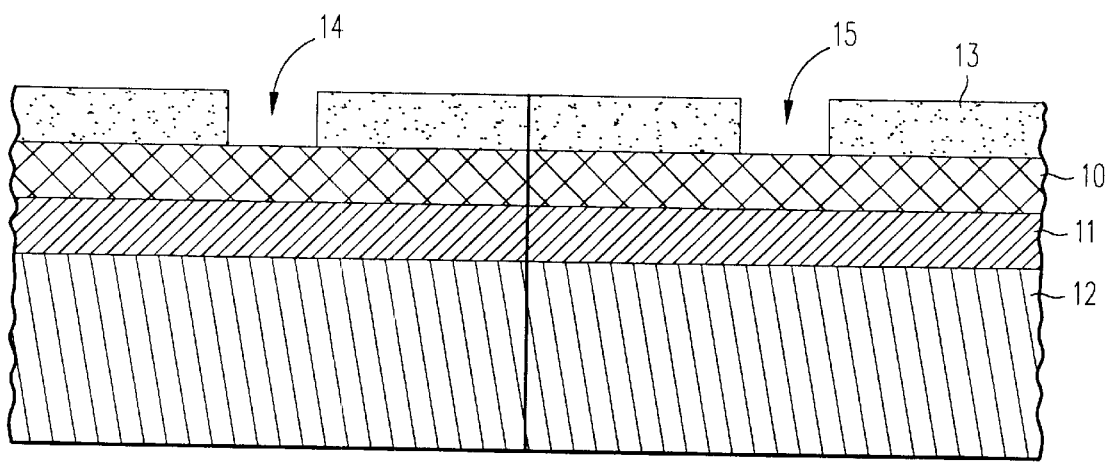

In FIGS. 3 and 4, representing respective top and side views, a photoresist 13 (either positive or negative polarity) is deposited on the layer of dielectric 10 or any other surface to be acted upon after the resist is patterned. Resist 13 is then exposed by a light source through a standard precision mask. After exposure, the resist is developed and resist openings 14 and 15 are defined. While many possible openings normally exist, FIG. 4 shows only two possible openings 14 and 15 for simplicity and illustrative purposes. Possible openings can include vias and cut points.

Figure 5:
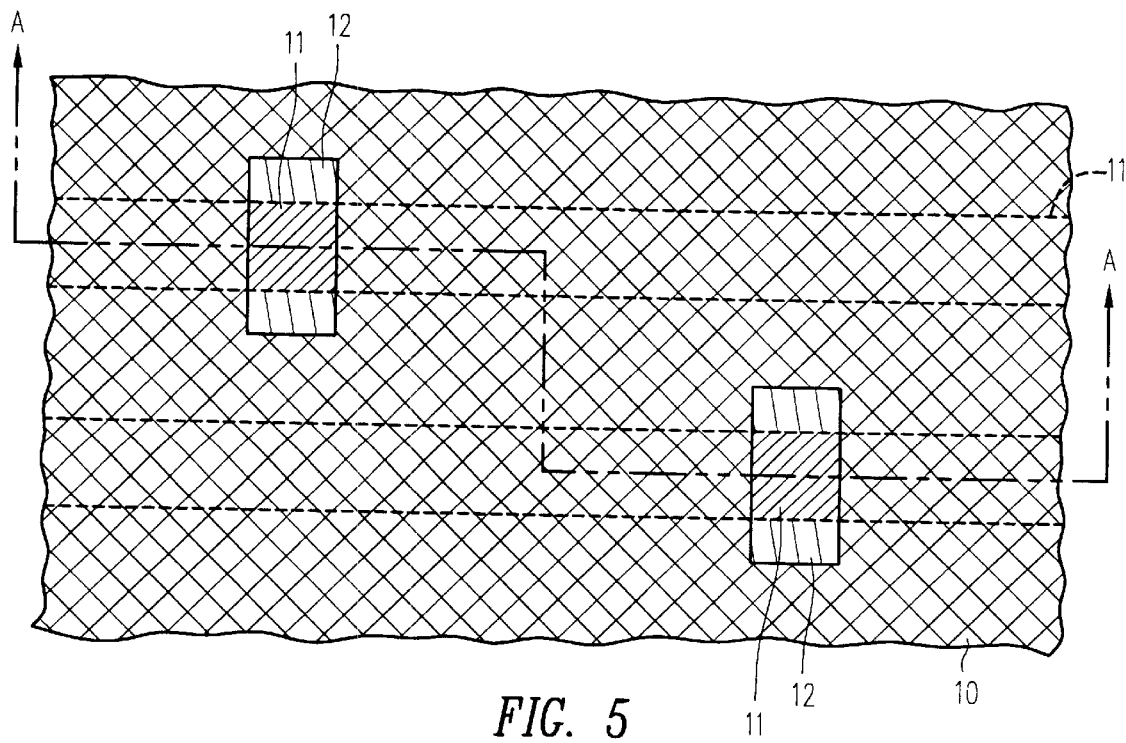
Figure 6:
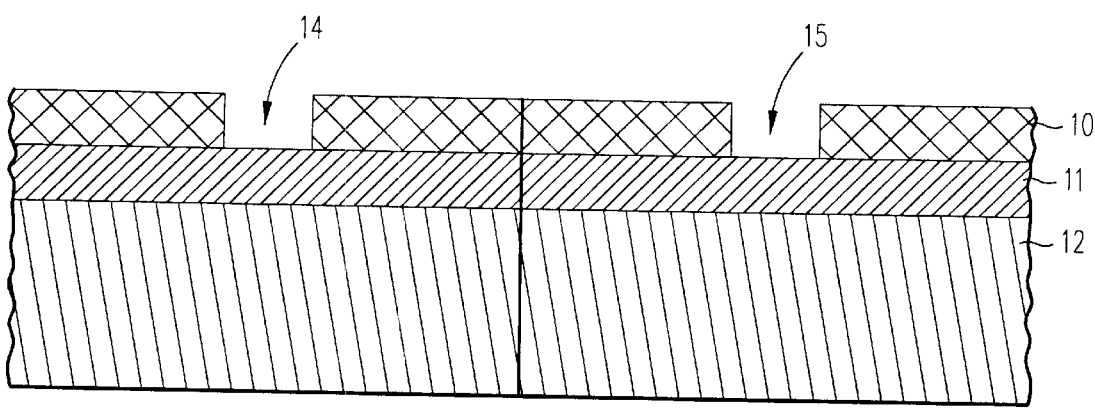
Figure 6A:
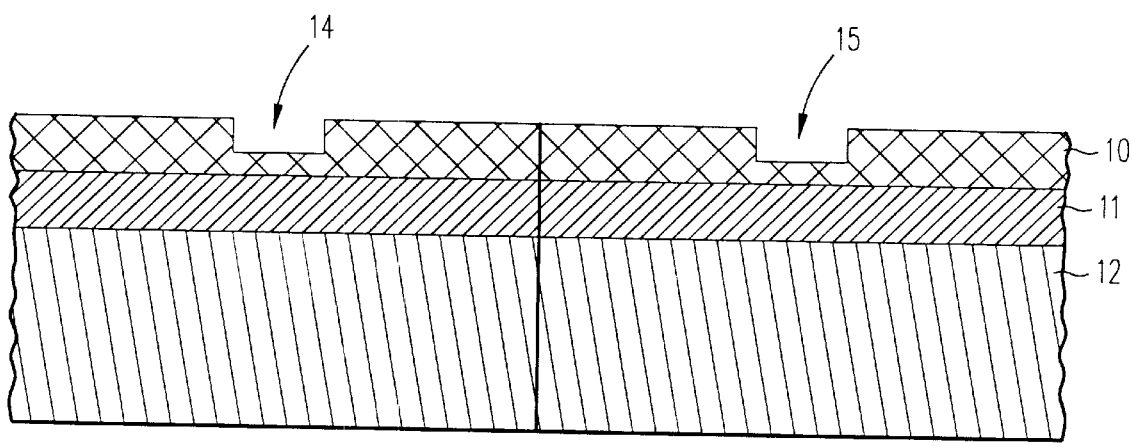

The device is then etched to remove the layer of dielectric 10 in the openings 14 and 15 previously defined and shown in FIG. 4. Then resist 13 is removed, resulting in the device shown in FIGS. 5 and 6, representing respective top and side views. In other embodiments, the layer of dielectric 10 is partially etched at the openings 14 and 15, as shown in FIG. 6A, which leaves a thin layer of dielectric remaining above the metal interconnect layer 11 at locations 14 and 15 to protect the underlying metal interconnect layer 11. This is particularly beneficial when the device will be exposed to moisture or stored for a long period of time, which could cause any exposed metal to become corroded or damaged.

Figure 7:
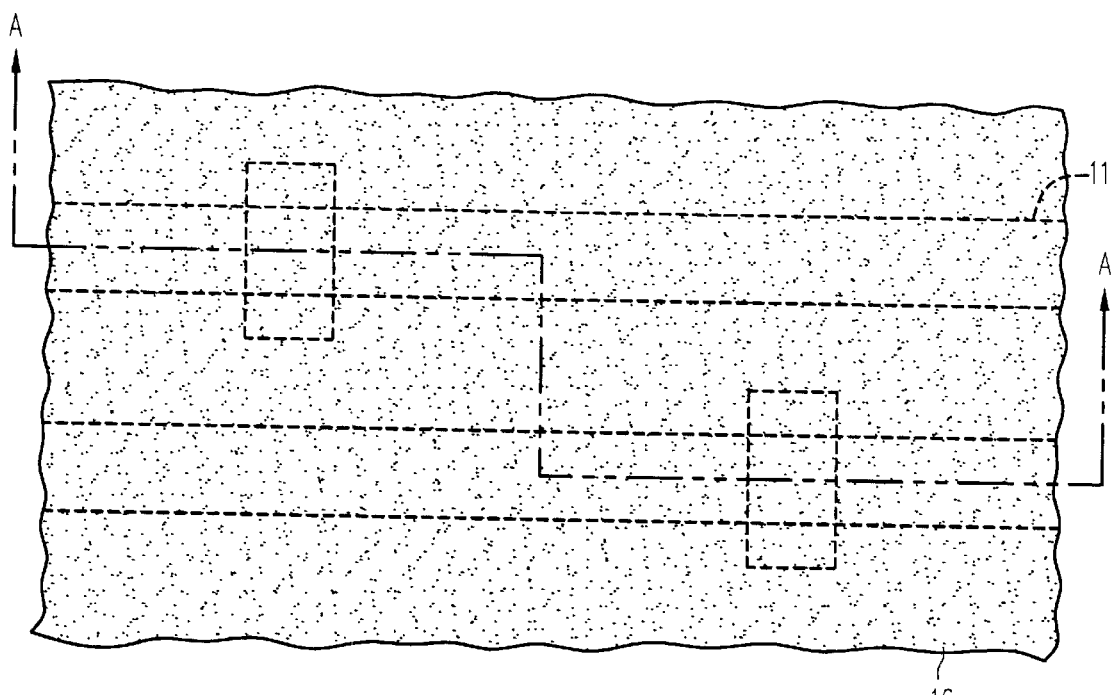
Figure 8:
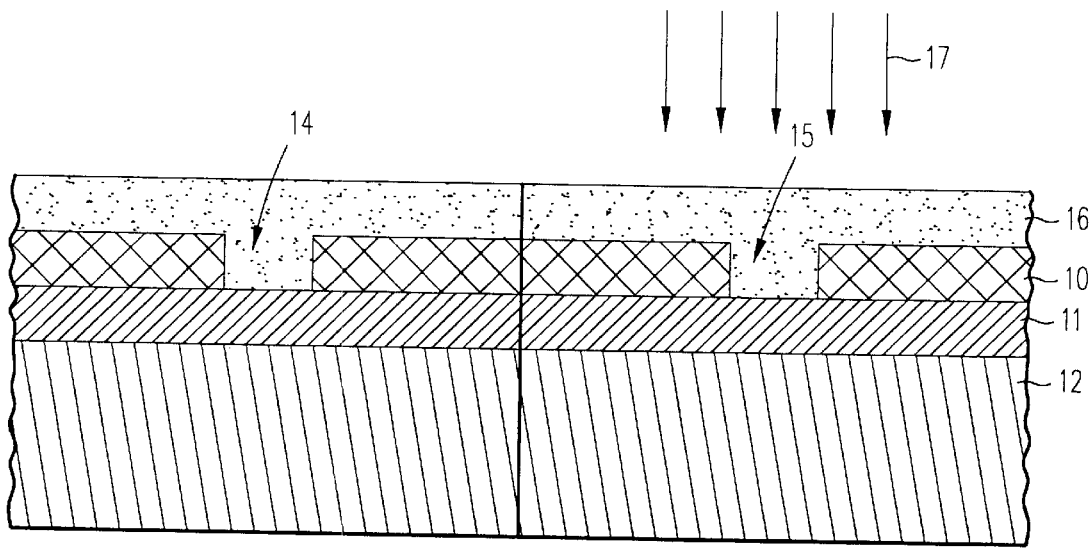

In FIGS. 7 and 8, representing respective top and side views, a second resist 16 is deposited on the patterned layer of dielectric 10 to fill the openings 14 and 15. A laser 17 then exposes areas over undesired cut points (over opening 15 in FIGS. 7 and 8). The exposed areas are typically larger than the dimensions defined by the standard mask, thereby requiring less precision for the second exposure step.

Figure 9:
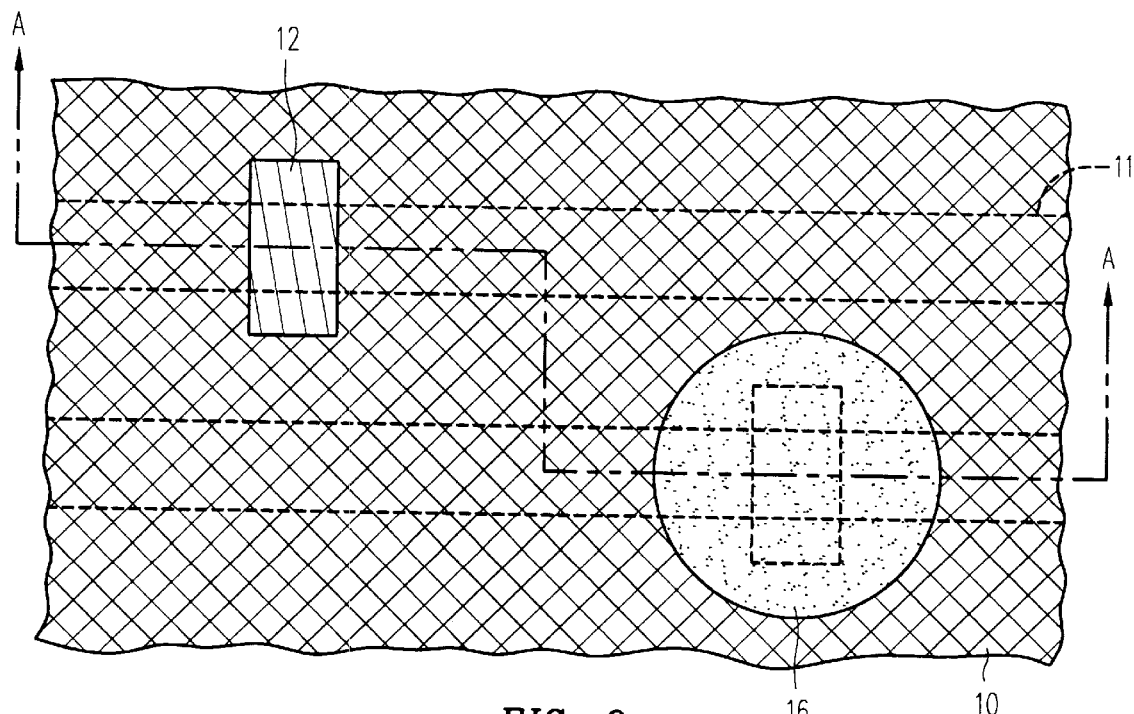
Figure 10:
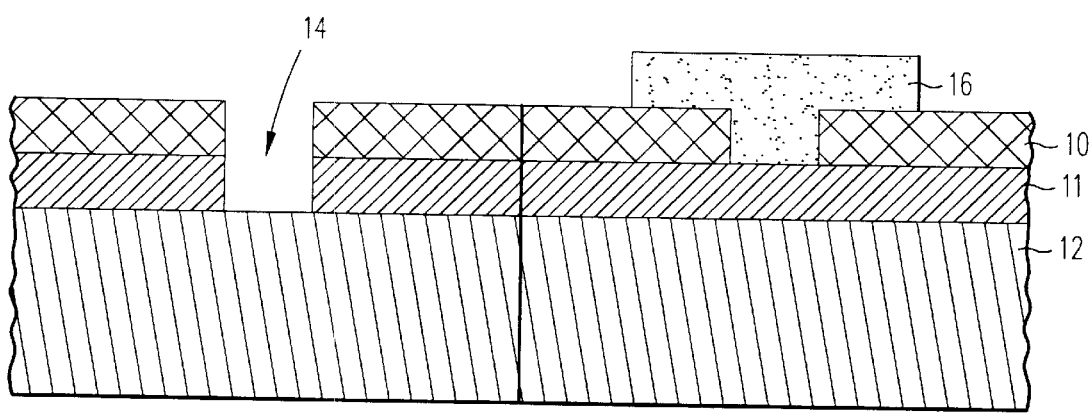
Figure 11:
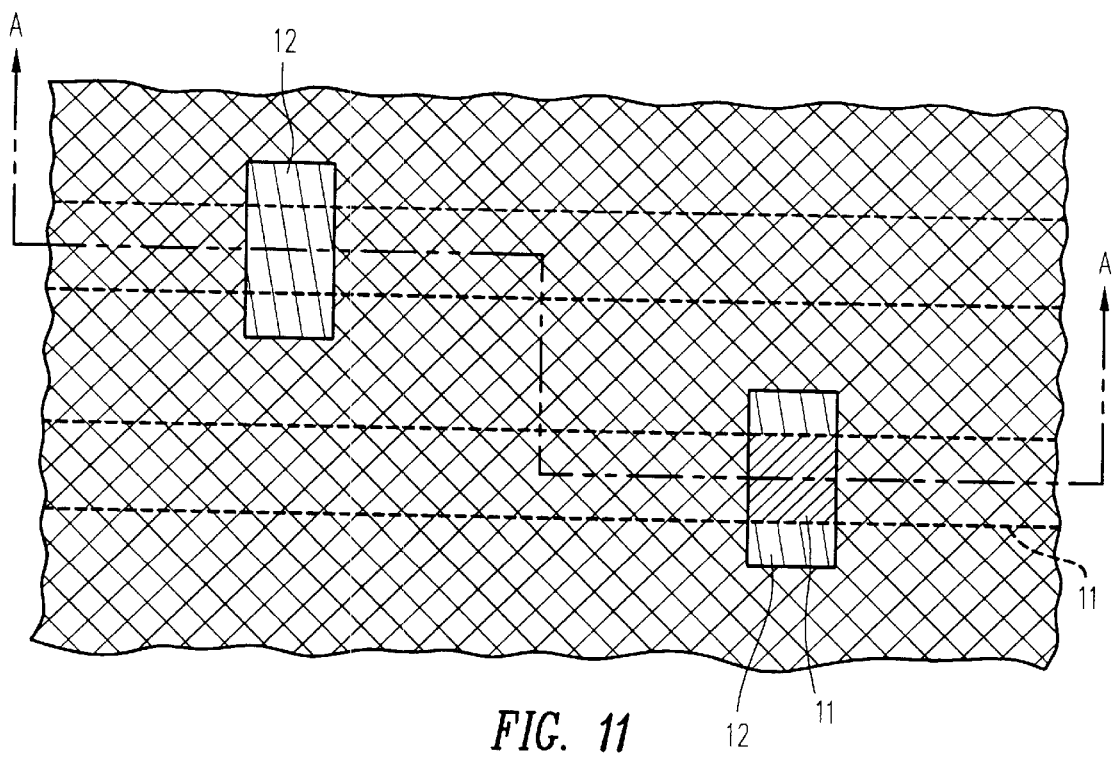
Figure 12:
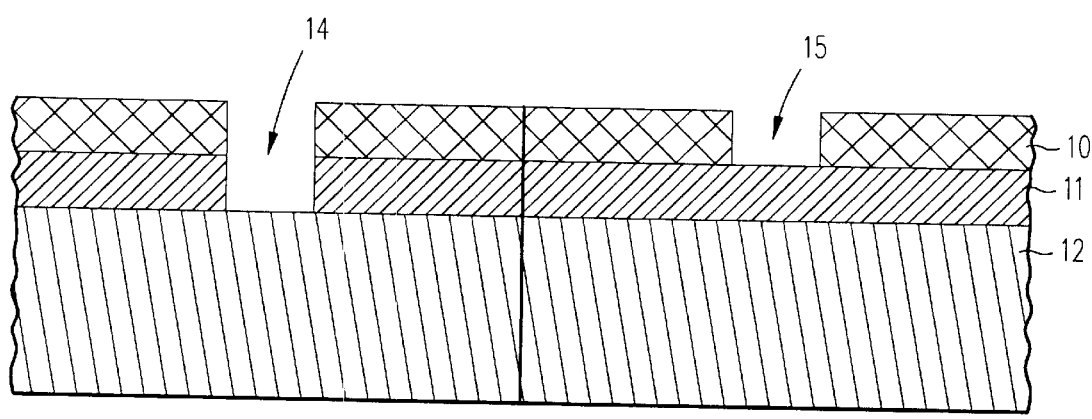

In FIGS. 9 and 10, representing respective top and side views, the resist 16 is then developed to uncover desired opening 14. The metal interconnect layer 11 (and the thin layer of dielectric if the dielectric layer was only partially etched previously) at the desired opening 14 is etched with the pattern of the selected openings defined by the combination of dielectric 10 and resist 16. In FIGS. 11 and 12, representing respective top and side views, the remaining portions of resist 16 have been removed, leaving a connection in cut point area 15 and a disconnection in cut point area 14. Note that the resist 16 shown in FIGS. 7 to 10 is negative polarity; however, it will be obvious to one skilled in the art that a positive polarity resist could also be used. In this case, the resist 16 would be exposed by the laser 17 over the desired cut point area 14.

Figure 13:
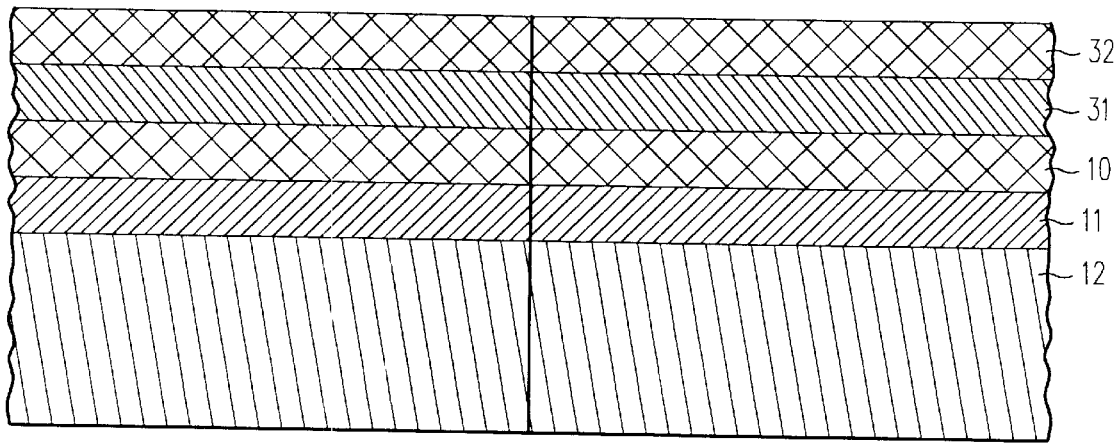
FIGS. 13–16 are illustrative sectional views representing steps to pattern two layers of dielectric and two layers of interconnect using two layers of photoresist according to another embodiment of the present invention.
Figure 14:
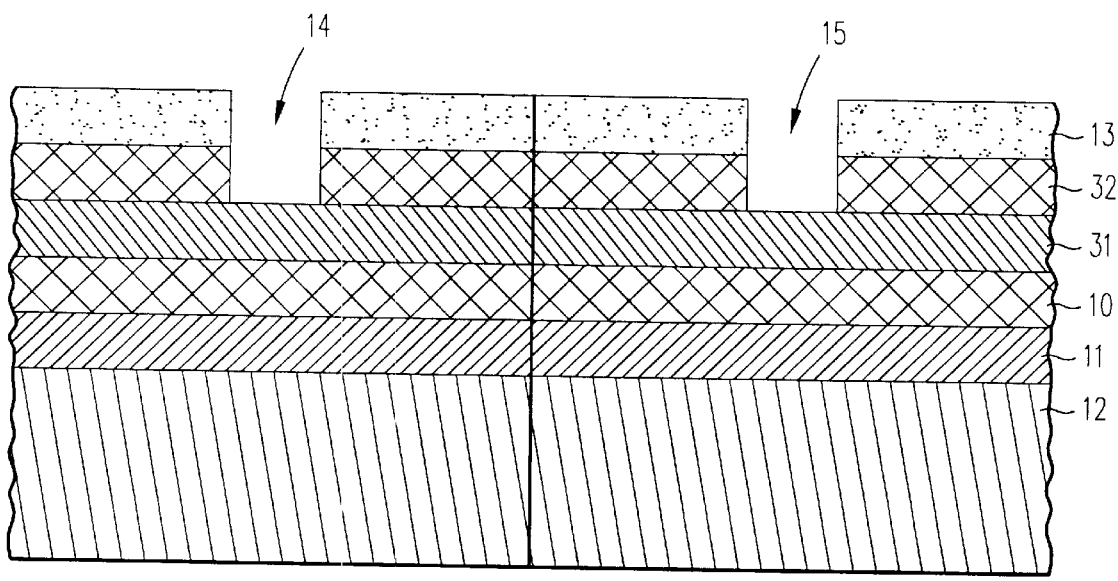

FIGS. 13–16 illustrate another embodiment of the present invention for patterning two layers of dielectric and two layers of interconnect using two layers of photoresist. In FIG. 13, representing a side view, the metal interconnect layer 11 is formed over structure 12, a first layer of dielectric 10 is formed over metal interconnect layer 11, a second metal interconnect layer 31 is formed over the first dielectric layer 10, and a second layer of dielectric 32 is formed over the second metal interconnect layer 31. In FIG. 14, photoresist 13 (either positive or negative polarity) is deposited on the second dielectric layer 32 or any other surface to be acted upon after the resist is patterned. Resist 13 is then exposed by a light source through a standard precision mask and developed to uncover possible openings 14 and 15. While many possible openings normally exist, FIG. 14 shows only two possible openings 14 and 15 for simplicity and illustrative purposes. The second dielectric layer 32 is then etched at possible openings 14 and 15, resulting in the device shown in FIG. 14. In other embodiments, the first dielectric layer 10 is partially etched to leave a thin layer of dielectric remaining above the metal interconnect layer 11, using steps similar to those described and shown in FIG. 6A.

Figure 15:
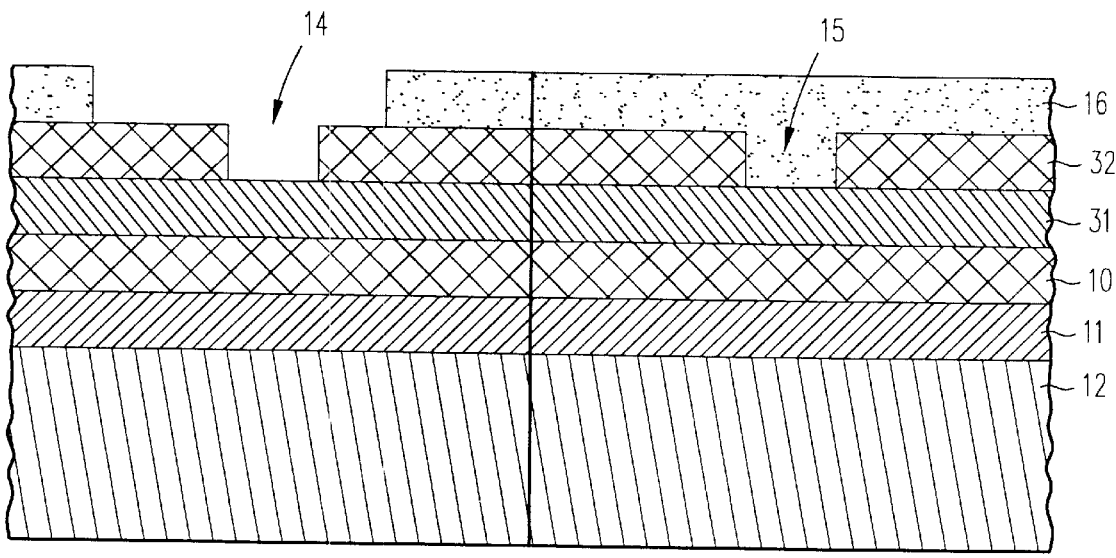

In FIG. 15, the remaining portions of resist 13 have been removed, and a second resist 16 is deposited on the patterned second layer of dielectric 32. A laser then exposes areas over desired cut points, where the exposed areas are typically larger than the dimensions defined by the standard mask. The resist 16 is then developed to uncover desired opening 14.

Figure 16:
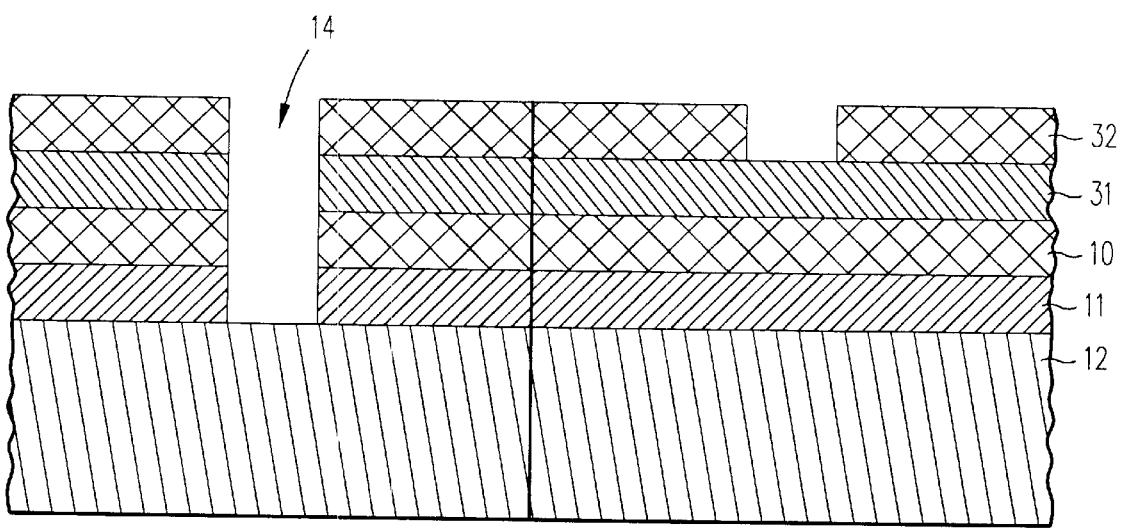

In FIG. 16, the second metal interconnect layer 31, first dielectric layer 10, and first metal interconnect layer 11 are etched at the desired opening 14 with the pattern of the selected openings defined by the combination of second dielectric layer 32 and openings in resist 16. The three layers 31, 10, and 11 can be etched during a single step or sequentially in separate steps. The remaining portions of resist 16 are removed leaving the desired cut point 14 through two metal interconnect layers 11 and 31 and first dielectric layer 10. This process can be extended to pattern additional metal and/or dielectric layers. Thus, two or more layers can be patterned at the same time, thereby reducing the number of steps needed to customize a multi-layer device. Note that the resist 16 shown in FIGS. 13 to 16 is positive polarity; however, it will be obvious to one skilled in the art that a negative polarity resist could also be used. In this case, the resist 16 would be exposed by the laser 17 over the undesired cut point area 15.

Figure 17:
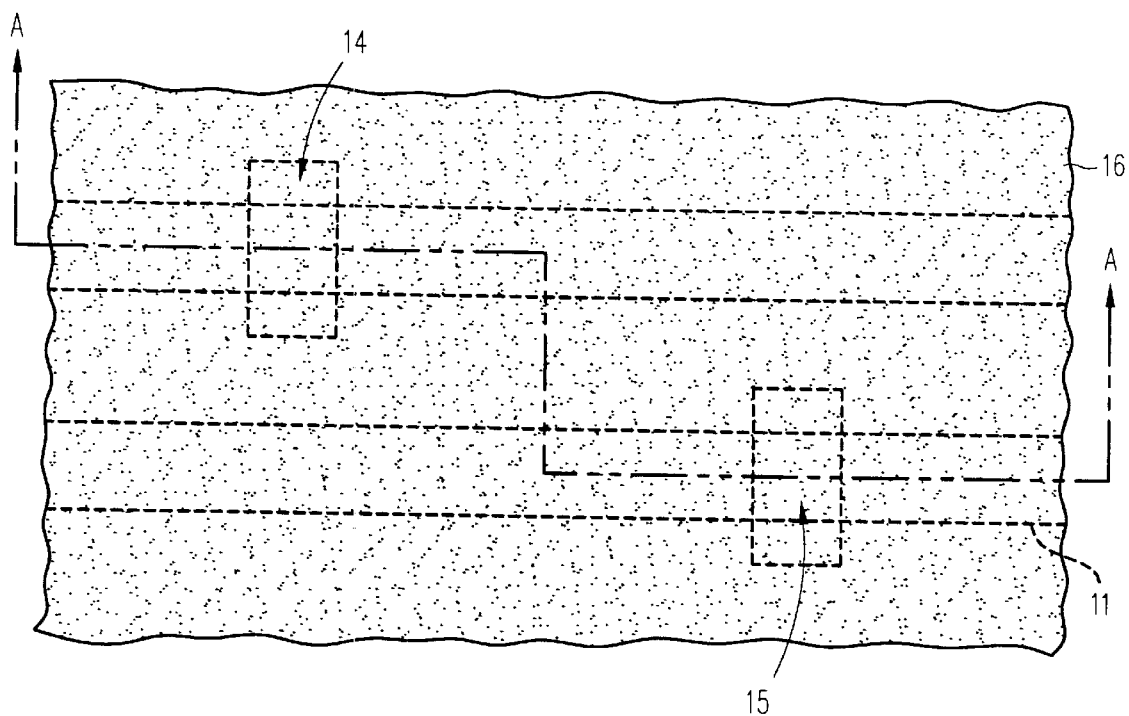
FIGS. 17–22 are illustrative top and sectional views representing steps to pattern two dielectric layers and an interconnect layer using two photoresist layers according to another embodiment of the present invention.
Figure 18:
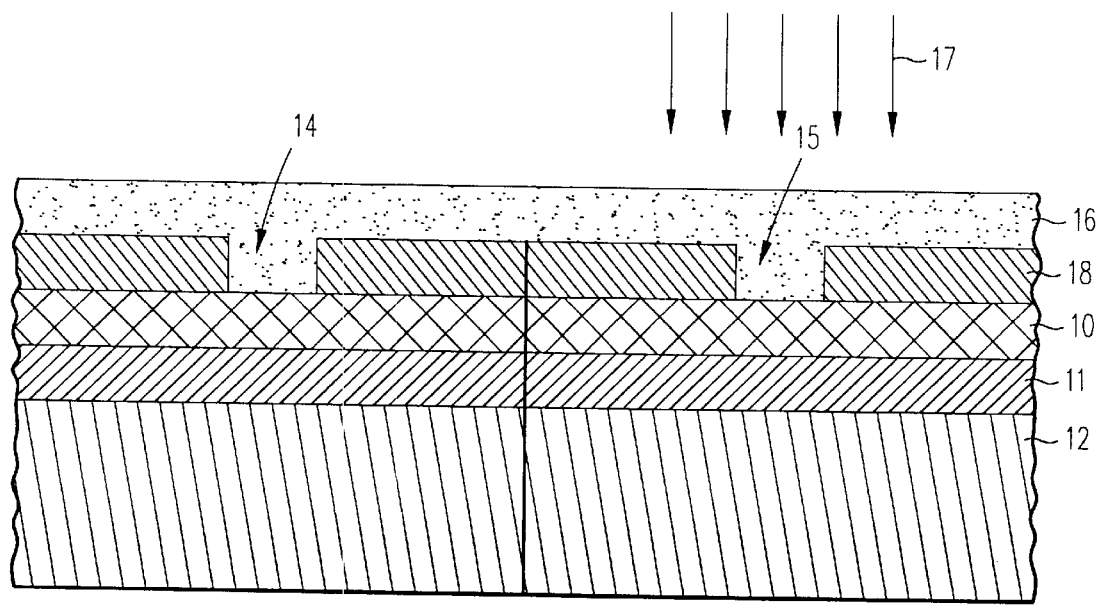

FIGS. 17–22 illustrate another embodiment of the present invention for patterning two layers (one dielectric and one passivation) and an interconnect layer using two photoresist layers. In FIGS. 17 and 18, representing respective top and side views, a topside passivation layer 18 has previously been patterned, developed, and etched to create the current defined openings 14 and 15 over the lower dielectric layer 10. A passivation layer will be generally described as a layer of material applied to the device for the purposes of providing a barrier for moisture or scratch protection. A second layer of resist 16 is deposited on the passivation layer 18 to fill the openings 14 and 15. A laser 17 then exposes the area over opening 15, where the exposed areas are typically larger than the dimensions defined by the standard mask. The portion underlying opening 15 is to remain intact.

Figure 19:
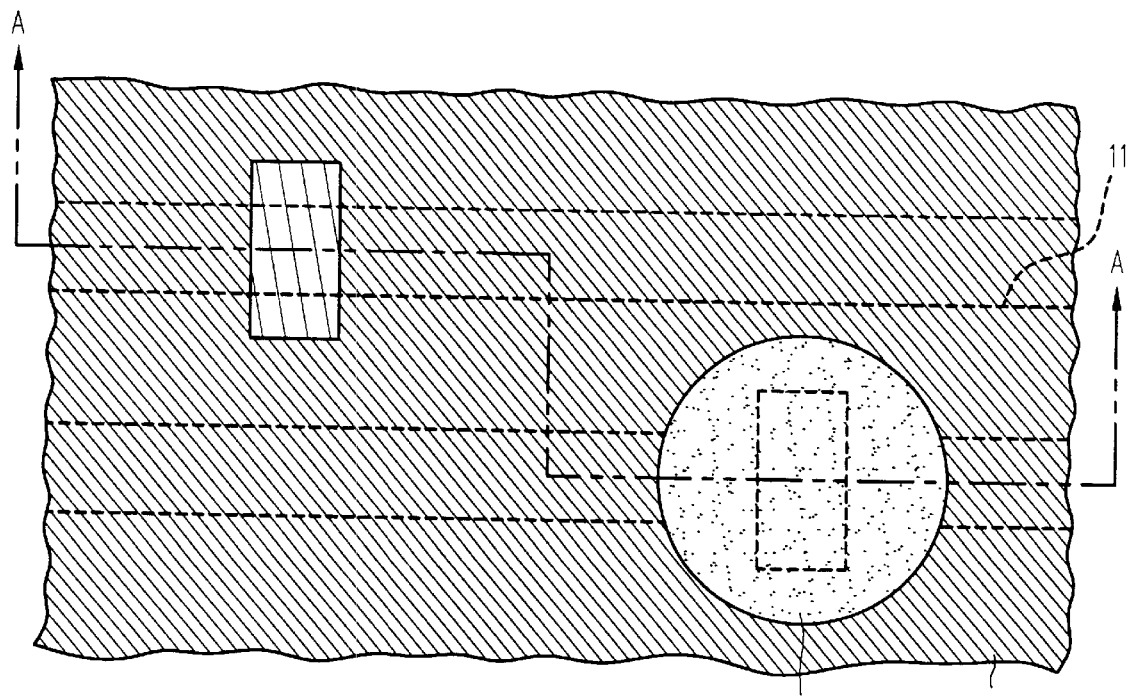
Figure 20:
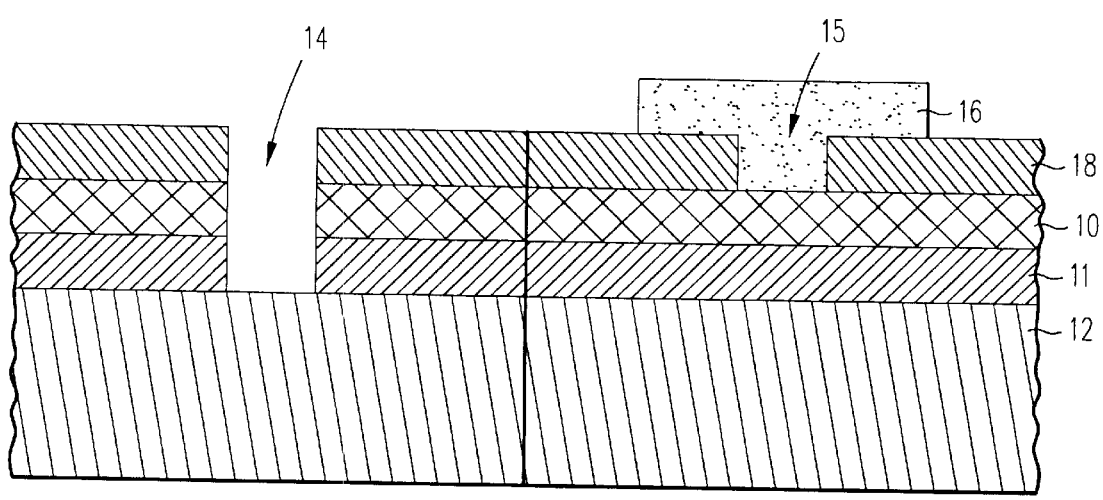

In FIGS. 19 and 20, representing respective top and side views, the resist 16 is then developed to uncover desired opening 14. The passivation layer 18 is then etched, and the lower dielectric layer 10 is etched with the pattern of the selected openings defined by the combination of passivation layer 18 and openings in resist 16. The material of the passivation layer 18 has etching properties dissimilar enough from the underlying dielectric layer 10 to limit the etch of the passivation layer 18 in order to maintain specific possible cut locations. For example, passivation layer 18 might consist of cured polyimide, while lower underlying layer 10 might consist of undoped silicon oxide. Since the cured polyimide has a higher density than the oxide, it will tend to have a lower etch rate when being etched in a plasma etch machine. Alternatively, passivation layer 18 might consist of silicon nitride layer, which would have a lower etch rate than the oxide when being etched in a wet chemical such as hydrogen fluoride (HF). In either case, the passivation layer 18 serves as an effective barrier to the etch so that the pattern of selected openings in the passivation layer 18 is transferred to the lower underlying layer 10.

Figure 21:
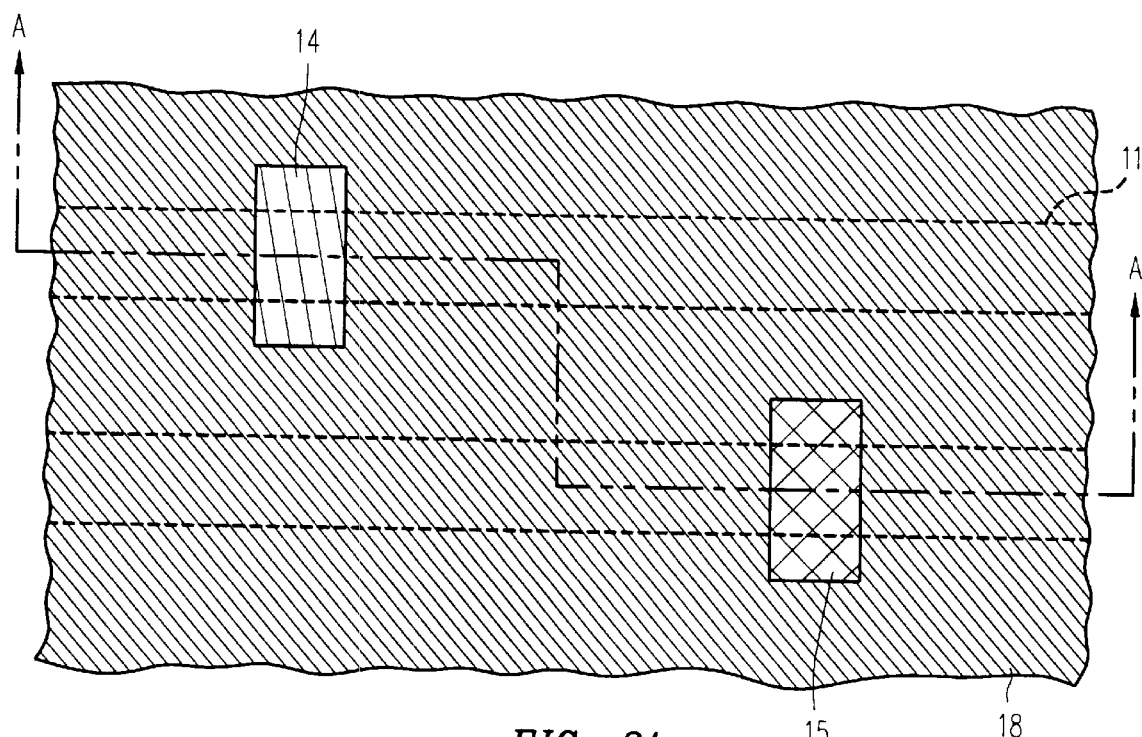
Figure 22:
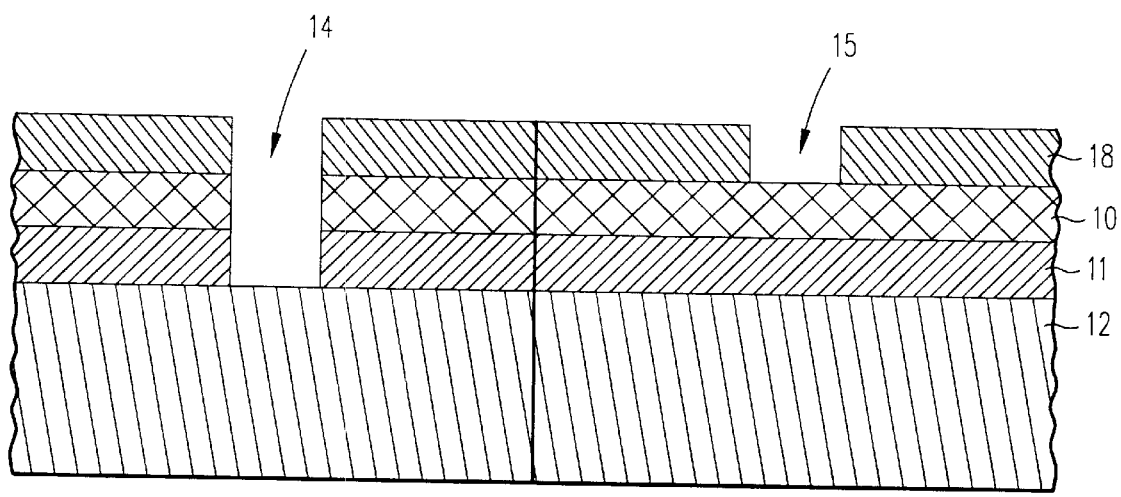

The metal interconnect layer 11 at the desired opening 14 is then etched with the pattern of the selected openings defined by the combination of layers 18 and 10 and openings in resist 16. The metal interconnect layer 11 can also be etched at the same time that lower dielectric layer 10 is etched. In FIGS. 21 and 22, representing respective top and side views, the remaining portions of resist layer 16 shown in FIG. 20 are removed leaving the desired openings 14 as defined. Thus, customization can be performed right before device shipment, i.e., after the processing step of applying the passivation layer, thereby reducing manufacturing time and costs. Again, note that the resist 16 shown in FIGS. 17 to 20 is negative polarity; however, it will be obvious to one skilled in the art that a positive polarity resist could also be used. In this case, the resist 16 would be exposed by the laser 17 over the desired cut point area 14.

Figure 23:
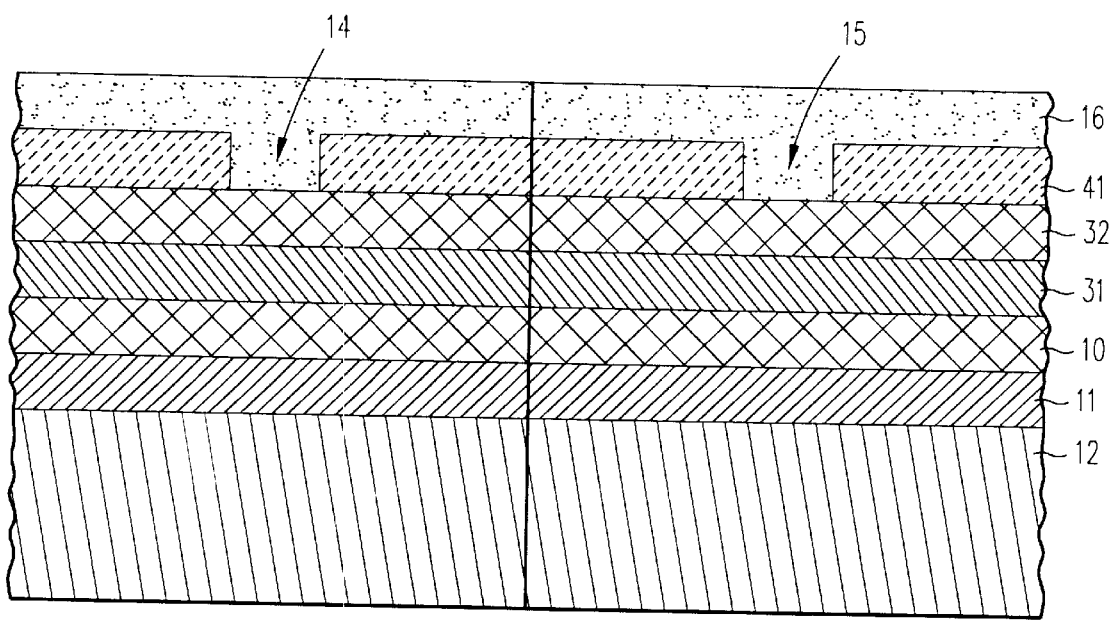
FIG. 23 is an illustrative sectional view of a step to pattern three dielectric layers and two interconnect layers using two photoresist layers according to another embodiment of the present invention.

FIG. 23 shows another embodiment of the present invention for patterning three layers (two dielectric and one passivation) and two interconnect layers using two photoresist layers. In FIG. 23, a third layer 41 (e.g., a passivation layer) is deposited over second dielectric layer 32, followed by deposition of the photoresist layer 13 on the structure shown in FIG. 13. The third layer 41 is patterned with possible cut points using precision lithography, and then the second photoresist layer 16 is deposited over the third layer 41 to fill the possible cut points. The device can then be customized following steps similar to those described and shown in FIGS. 17–20. Thus, multiple layers can be customized simultaneously after deposition of the passivation layer.

In the above embodiments, it will be understood by one skilled in the art that the application of the second resist (which is negative in the above embodiments) can be replaced with a positive resist process. When using a positive resist process, a laser now exposes all possible cut points which are to be etched rather than exposing the areas which remain covered during the metal etch for a negative resist process. Furthermore, all etch steps have been shown in the illustrations to be perfectly selective, but may in practice be etched somewhat into other materials exposed to the etch.

Examples of subsequent processing steps using the above-described methods of patterning resist are given in commonly-owned U.S. patent application Ser. Nos. 08/823,777, 08/823,778, 08/846,163, and 08/879,542 referenced above.

Although optical reduction steppers and laser machines are used in the description of this invention, any precision lithographic system used in conjunction with any direct-write system is also suitable for carrying out the present invention. Further, it will be understood by one skilled in the art that a negative resist process can be replaced with a positive resist process with image reversal to achieve the same results. Additionally, the processes defined with single develop steps may be replaced with multiple develop steps for positive resist processing.

Figure 24:
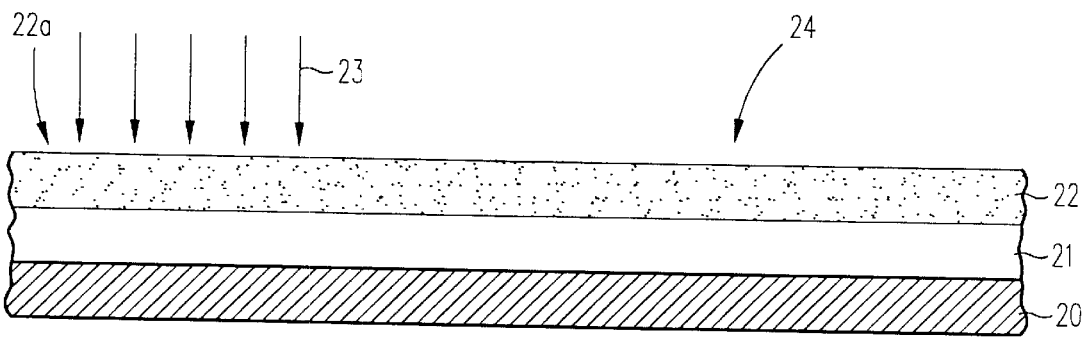
FIGS. 24–28 are illustrative top and sectional views representing a method for creating a non-precision mask for use in the present invention.
Figure 25:
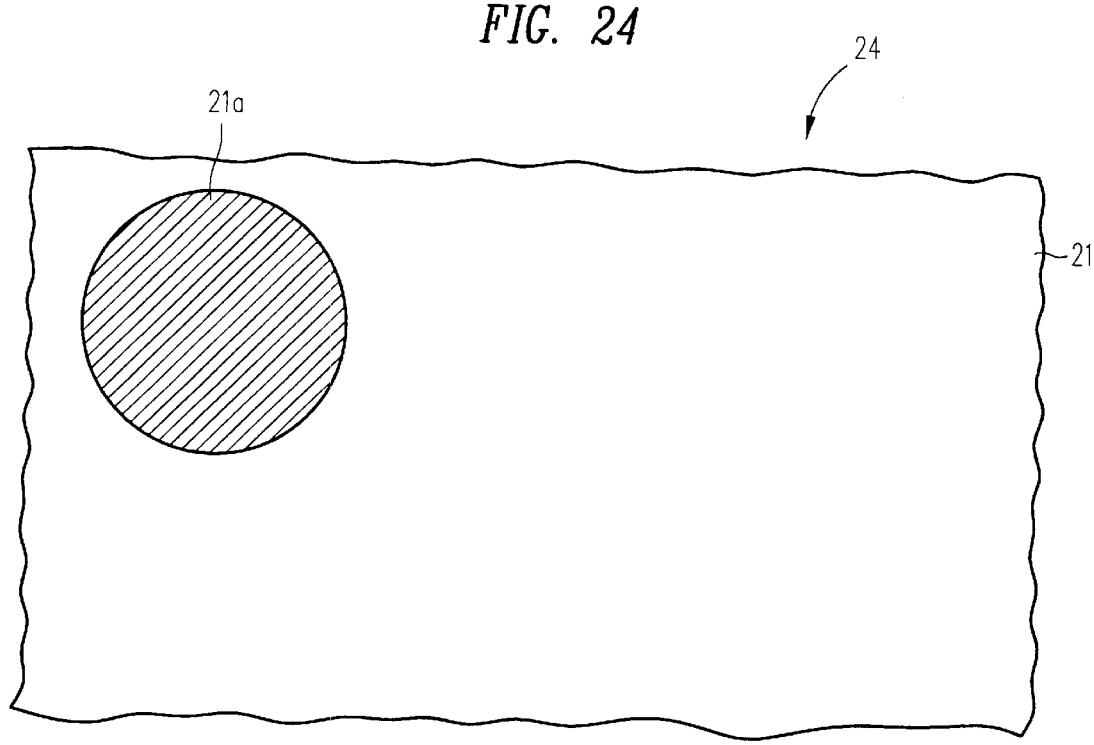
Figure 26:
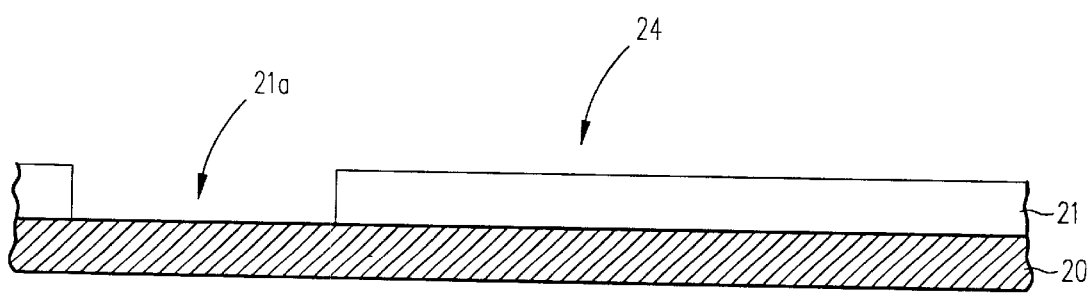

In the above described methods, a laser is used as the tool for the non-precision step processing. Alternatively, rather than using a laser to expose the resist, irradiation through a laser-manufactured non-precision mask can also be used. FIGS. 24–28 illustrate one way to manufacture and use such a mask. In FIG. 24, a mask blank 20 is covered with an opaque material 21, which is covered by a positive resist layer 22. A laser 23 then exposes desired portions of resist layer 22, and the selected portions of the resist 22a and opaque layers 21a in FIGS. 25 and 26 are removed using conventional methods. After the remaining portions of resist 22 are removed, mask 24 is formed as shown in FIGS. 25 (top view) and 26 (sectional view). An alternative method of forming mask 24 uses direct ablation by a laser to remove opaque material 21 in area 21a, thereby eliminating the need for a resist layer.

Figure 27:
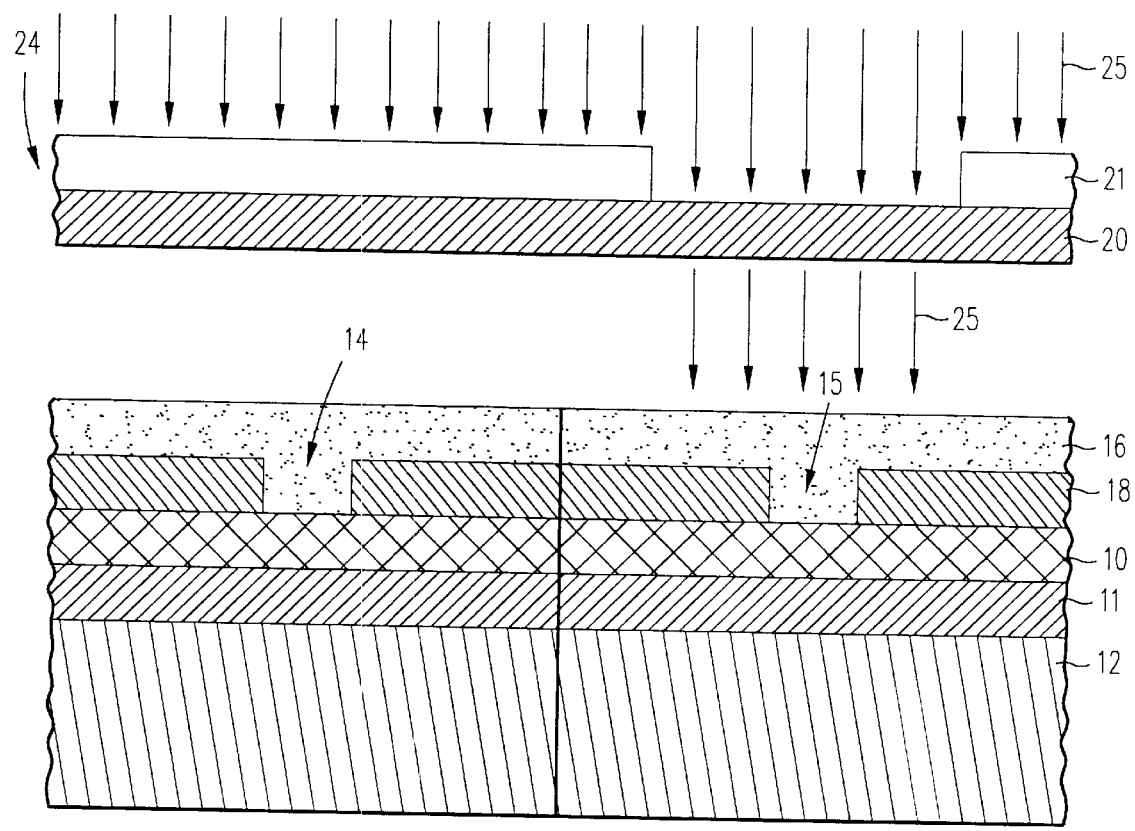
Figure 28:
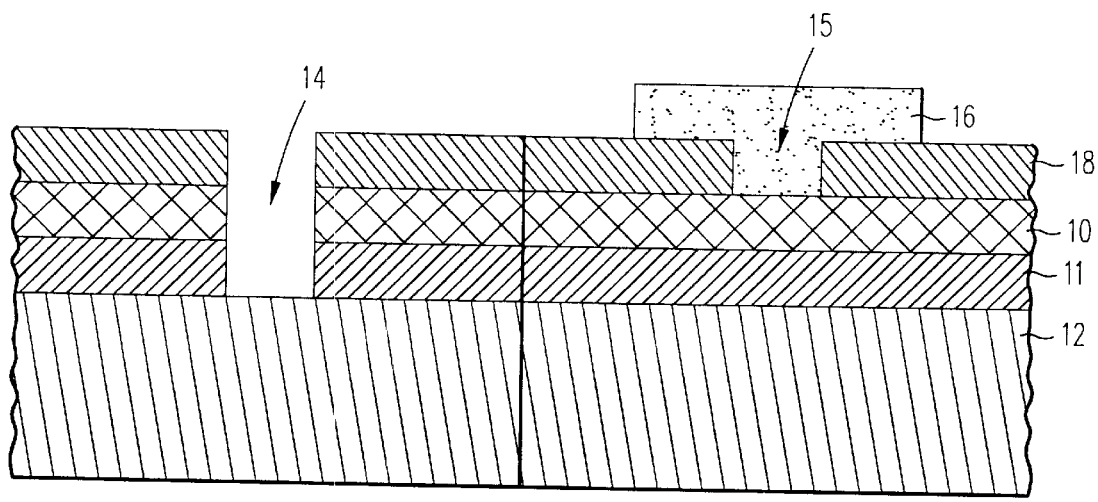

The non-precision custom mask 24 can then be used in place of the laser step in the previous embodiments for patterning the resist, as shown in FIGS. 27 and 28 for example. In FIG. 27, light 25 is radiated through mask 24 and onto a negative photoresist 16 overlying passivation layer 18 and dielectric 10, metal interconnect layer 11, and structure 12, as described above with respect to FIGS. 17 and 18. The opening in mask 24 exposes a portion of the photoresist 16 overlying an undesired configuration point 15, while leaving portions overlying a desired configuration point 14 unexposed. Then, in FIG. 28, photoresist 16 is developed to uncover desired configuration point 14. Passivation layer 18 is then used as a mask to etch the underlying layers 10 and 11.

In the above laser-manufactured non-precision mask embodiments, it will be understood by one skilled in the art that the application of the positive resist can be replaced with a negative resist process along with the appropriate resist change for the circuit processing.

Using laser manufactured non-precision configuration masks provides many advantages not found in using a laser directed on the resist layer. Using a configuration mask to select resist openings or connections allows an entire photoresist layer on an integrated circuit or a series of integrated circuits to be exposed at once, thereby greatly reducing the time spent at the exposure step, increasing the throughput, and reducing manufacturing costs when large volumes of units are required. In addition, laser use is greatly reduced because the laser is needed only to manufacture a configuration mask rather than to directly expose patterns on each photoresist layer of an integrated circuit. For example, if five hundred openings are required to customize or pattern an IC, it would require five million laser pulses to manufacture ten thousand devices of this design. However, if a non-precision configuration mask of the present invention is used, only five hundred laser pulses are needed to produce the same number of devices.

The non-precision configuration mask provides additional advantages. Because of the reduced dimension control, registration, and volume of data requirements, the non-precision configuration mask is much less costly and time-consuming to manufacture than precision configuration masks, which results in a reduction of the per design fixed costs for the manufacture of the end units. The non-precision nature of the mask also reduces the requirements, and therefore the cost, of the stepper (or aligner) used to apply the image of the configuration mask to the resist. Using, preferably, an older and less costly generation stepper with lower resolution capability than that of the standard precision masks allows the laser manufactured non-precision mask to be less precisely made because small imperfections in the edge definition of the mask and small splatters of debris, foreign matter, or other mask defects will not be resolved onto the resist. As a result, the susceptibility to defects in the manufacture of the mask or to later contamination during storage or use of the mask is reduced.

The above-described methods to pattern photoresist offer several advantages over previous methods of patterning photoresist to customize integrated circuits. Because no precision configuration mask is required for each different customization, both the cost and lead-time to produce an application-specific integrated circuit (ASIC) are reduced. In the present invention, the only precision masks required are those used to form the ASIC blank which is then available for use by a large number of possible designs. ASIC blanks can be stored until they are ready to be customized, which then only requires a laser to selectively define the desired areas to be connected or disconnected. Prior methods require manufacturing precision configuration masks for each new design, which greatly increases the cost and latency between the time the user provides the design to the manufacturer and the time the user receives the ASIC. Therefore, per design costs and the time to delivery are reduced. Furthermore, since the time required to prepare for the actual customization of the die is now only the time needed to determine the coordinates and control signals for the laser machine, near instantaneous release of the design to the production facility is possible when compared to the time required to manufacture and check a precision configuration mask. In addition, the per design expense of the precision configuration masks are eliminated.

Additionally, the production of small numbers of units becomes economically feasible with the present invention. Often the need to check system designs with actual working ICs leads to the need for prototype units to be built in very small quantities, often two dozen or less. The present invention allows this to be done economically by both eliminating the need for precision configuration masks and allowing multiple custom devices to be built on the same wafer. Previous methods which required the production of one or more precision configuration masks for each design would require that large numbers of units be produced in order for the per-design mask purchase costs to amortize down to reasonable per unit costs. The present invention allows for designs to be implemented without such costs and the need to amortize them, such that production of very small lot quantities, including quantities of less than a full wafer, become economical.

An alternative use of lasers in the industry is to blast connecting links between circuits (laser fuses) allowing customization or repair of circuitry. The present invention has advantages over this previous method in that the energy delivery to the device by the laser is very low. Consequently, cut points or connection points in the present invention can be placed above active circuitry in contrast to laser fuses of previous techniques, which dictate that circuitry or conductors lie outside the laser spot diameter in order to avoid damage. The methods described above further eliminate problems associated with laser fuses. Common repair practices include using laser-blown fuses, laser-connected antifuses or electrically programmed bits to control the deactivation of defective circuit sections and the activation of replacement circuit sections. Using methods of the present invention, activation and deactivation can be controlled by conductors, which may be selectively connected or disconnected for each specific IC to effectuate repairs within a smaller die area and with a tighter pitch between elements than with prior techniques. With prior methods, laser fuses and conductors, which carry signals in and out of the fuses, must be separated from one another by more than the minimum pitch of the conductor layer on which they are formed because current resolution of laser spot sizes are above the dimensions of lines and spaces formed through precision masking techniques. The present invention eliminates this problem by allowing laser fuses to be replaced with, for example, potential cut points on lines spaced at the minimum attainable conductor pitch, at spot sizes up to about two times the minimum pitch, resulting in a significant reduction in die size. In addition, for some semiconductor devices such as DPAMs and SRAMs, the fuse pitch can limit the pitch of the circuit elements connected to the fuses. The present invention would thus reduce the area required not only in the fuse regions but in other parts of the circuit as well, resulting in a significant savings in the overall die size.

The present invention also reduces cost of the laser machine due to the lower energy delivery and the less exacting energy delivery controls needed to avoid device damage. The cost of the laser machine may also be reduced because the spot size requirements are less restrictive in the present invention than previous methods utilizing laser fuses. This is because the only area affected by the laser is defined by the overlap of the standard precision cut-point mask and the area exposed (or not) by the laser. The dimensions of this overlap are therefore determined by the dimensions of the precision cut-point mask rather than the laser spot size.

The detailed description is provided above to illustrate specific embodiments of the present invention and is not intended to be limiting. Numerous modifications and variations are possible within the scope of the present invention. For example, these techniques are not limited to production of ASICs, but apply to any photo-defined process requiring the alteration of the photo-defined areas beyond one standard pattern. Other applications of these techniques include the production of read-only memories (ROMs), the selection of alternative modes of operation of standard devices, and the repair of memory or logic circuits. The present invention is defined by the appended claims.

What is claimed is:

1. An electronic circuit structure, comprising:

a patterned conductive layer;

an insulative layer overlying said conductive layer, wherein said insulative layer has N, greater than one, first openings overlying possible configuration points on said conductive layer, wherein said first openings are formed by a precision technique; and a photoresist layer overlying said insulative layer, wherein said photoresist layer has between 1 and N−1 second openings exposing desired ones of said first openings, wherein said second openings are formed by a non-precision technique.

2. The structure of claim 1, wherein said electronic circuit is an integrated circuit.

3. The structure of claim 1, wherein said first openings extend completely through said insulative layer.

4. The structure of claim 1, further comprising:

a second insulative layer overlying said patterned conductive layer; and a second conductive layer overlying said second insulative layer, wherein said second insulative and second conductive layers are between said patterned conductive layer and said insulative layer.

5. An electronic structure, comprising:

a patterned conductive layer;

an insulative layer overlying said conductive layer, wherein said insulative layer has N, greater than one first openings overlying possible configuration points on said conductive layer, wherein said first openings are formed by a non-precision technique; and a photoresist layer overlying said insulative layer, wherein said photoresist layer has between 1 and N−1 second openings exposing desired configuration points of said first openings, wherein said second openings are formed by a precision technique.

6. An electronic circuit structure, comprising:

a patterned conductive layer;

an insulative layer overlying said conductive layer, wherein said insulative layer has at least two first openings overlying possible configuration points on said conductive layer, and wherein said first openings extend partially through said insulative layer; and a photoresist layer overlying said insulative layer, wherein said photoresist layer has at least one second opening exposing desired ones of said first openings.

7. An electronic circuit structure, comprising:

a patterned conductive layer;

an insulative layer overlying said conductive layer;

a passivation layer overlying said insulative layer, wherein said passivation layer has N, greater than one, first openings overlying possible configuration points on said insulative layer, wherein said first openings are formed by a precision technique; and a photoresist layer overlying said passivation layer, wherein said photoresist layer has between 1 and N−1 second openings exposing desired ones of said first openings, wherein said second openings are formed by a non-precision technique.

8. The structure of claim 7, further comprising:

a second insulative layer overlying said patterned conductive layer; and a second conductive layer overlying said second insulative layer, wherein said second insulative and second conductive layers are between said patterned conductive layer and said insulative layer.

* * * * *